United States Patent [19]
Kidder et al.

[11] Patent Number: 5,892,862
[45] Date of Patent: Apr. 6, 1999

[54] FLEXIBLE MIRROR OPTICAL SWITCH

[76] Inventors: John S. Kidder, 2609 West 10th Avenue, Vancouver, British Columbia, Canada, V6K 2J8; Jonathan Scott, 2838 St. Catherines Street, Vancouver, British Columbia, Canada, V5T 3Y7; Malcolm Chaddock, 4070 Dollar Road, North Vancouver, British Columbia, Canada, V6G 1Z6; David Todd, 2031 Collingwood Street, Vancouver, British Columbia, Canada, V6R 3K7; Ignacio Valenzuela, #38-7360 Minoru Boulevard, Richmond, British Columbia; Martin Poulin, #310-2226 West 8th Ave., Vancouver, British Columbia, both of Canada, V6K 2A7; Ronald Ninnis, 2525 York Avenue, Vancouver, British Columbia, Canada, V6K 1E4

[21] Appl. No.: 341,059

[22] Filed: Nov. 16, 1994

[51] Int. Cl.$^6$ ........................................................ G02B 6/35
[52] U.S. Cl. .................................. 385/16; 385/18; 385/12
[58] Field of Search .................................. 385/16, 17, 18, 385/12; 250/227.11, 227.13, 226

[56] References Cited

U.S. PATENT DOCUMENTS

| | | | |
|---|---|---|---|
| 3,999,074 | 12/1976 | Callaghan | 250/551 |
| 4,045,667 | 8/1977 | Hanson | 250/226 |
| 4,315,147 | 2/1982 | Harmer | 250/227.22 |
| 4,704,656 | 11/1987 | Neiger | 361/173 |
| 4,815,827 | 3/1989 | Lane | 385/18 |
| 4,904,044 | 2/1990 | Tamulevich | 385/56 |
| 5,046,806 | 9/1991 | Kidder et al. | 385/16 |
| 5,361,315 | 11/1994 | Lewis et al. | 385/16 |
| 5,408,552 | 4/1995 | Davenport et al. | 385/18 X |

*Primary Examiner*—John D. Lee
*Assistant Examiner*—Phan T. H. Palmer

[57] ABSTRACT

A fiber optic switching system which includes an optical switch having a movable actuator and a light fiber coupled to the actuator which terminates at an end surface thereof for conducting light from a light source to the optical switch mechanism. A flexible reflective film whose reflectivity is conditioned to provide at least two different reflective surfaces is positioned such that an end surface of the actuator abuts the film throughout its movement from one position to another. A detector detects light reflected from the film. The actuator is movable so as to direct light from the light fiber from the one reflective surface of the film to another and the detector detects light reflected from the film so as to determine which reflective surface of the film from which light has been reflected.

14 Claims, 10 Drawing Sheets

FLEXIBLE MIRROR OPTICAL SWITCH

FIELD

The invention relates to a fiber optic switch which utilizes a flexible filter and mirror assembly to reflect incident light back to the fiber.

BACKGROUND

The development of fiber optic switches has been a result of a need to avoid electrical power in the control lines and switches which can cause explosions in an explosive atmosphere and fatal shocks if in the presence of liquid.

U.S. Pat. No. 3,999,074, issued to Callaghan, discloses the general arrangement of utilizing light transmission to produce a variable electrical output signal to control an electronic switch which, in turn, controls power to a load.

U.S. Pat. No. 4,045,667, issued to Hanson, discloses a single fiber optical control system utilizing a fiber optic bundle to carry light from a transceiver to an optical selector via a fiber optic bundle. The light in the optical receiver is reflected back down the fiber optic bundle to the transceiver where it impinges on one of several photo-detectors depending upon the switch position. The photo-detectors distinguish the spectrum of coloured light to generate multiple electronic control states.

U.S. Pat. No. 4,315,147, issued to Harmer, discloses a two-position switch which has an active actuator that intercepts light passing from one segment of an optical fiber to another when the actuator is depressed and which permits such transmission when the actuator is in an extended position. Because of the need to insert the actuator between the fiber segments, there is a gap between the fiber segments which light must traverse in going from one segment to the other.

U.S. Pat. No. 4,904,044, issued to Tamulevich, discloses a flexible filter oriented between two optical fibers where it serves to filter light passing from one to the other. Again, the filter is spaced apart from each of the two fibers. Moreover, alignment of the two fibers is critical.

U.S. Pat. No. 5,046,806, issued to Kidder et al., in FIGS. 7 and 8 discloses a flexible filter attached on a carrier. Filters are positionable in front of a fiber by movement of a switch body. Again, a lens and a retro-reflector are used after the filter in order to focus and reflect the light back down the fiber.

U.S. Pat. No. 4,704,656 issued to Neiger discloses a single fiber control system using a mirror to reflect light received from a fiber back into the fiber when in a reflecting position. Upon moving the mirror into a non-reflecting position, light from the fiber is not reflected back into the fiber. The mirror is attached to the actuator which swings it in and out of position with respect to the fiber tip. The efficiency of the system is very sensitive to parallelism errors between the fiber face and mirror surface.

In any mirror actuator, the coupling efficiency of the reflected light and, therefore, the effectiveness of the signal detection is sensitive to alignment problems. The mirror actuator mechanism must locate the mirror surface parallel and in very close proximity to the fiber face in order to maintain good efficiency. In any system in which there is a gap between an end of the fiber and the mirror, the surfaces of the fiber and mirror will be prone to contamination. Both back scattering and contamination in such systems will cause loss of light and, hence reduced efficiency.

SUMMARY OF THE INVENTION

According to the invention there is provided a fiber optic switching system which includes an optical switch having a movable actuator and light fiber means coupled to the actuator which terminates at an end surface thereof for conducting light from a light source to the optical switch mechanism. A flexible reflective film whose reflectivity is conditioned to provide at least two different reflective surfaces is positioned such that an end surface of the actuator abuts the film throughout its movement from one position to another. Detector means detects light reflected from the film and returned by the fiber means. The actuator is movable so as to direct light from the light fiber means from the one reflective surface of the film to another, and the detector means detects light reflected from the film so as to determine from which reflective surface of the film light has been reflected.

A major advantage of the flexible film abutting the end of the actuator or fiber is the insensitivity of that arrangement to mirror misalignment. Because the flexible film conforms to the face of the fiber or actuator, it maintains the parallelism between mirror and fiber surfaces necessary to achieve high coupling efficiency.

By arranging the end of the fiber to abut the flexible film throughout its range of movement, contamination of the area between the fiber and film with fluids or air-borne particulate is greatly reduced. A third advantage of this arrangement lies in the reduction of Fresnel back reflections caused by fiber/air and air/filter interfaces which raise the level of bias noise reflected back to the detector.

The light fiber means may be a single optical fiber or a group of fibers providing a single optical path to and from the switching actuator.

A directional coupler may be coupled to the light fiber means to direct light returning from the optical switch mechanism to the detector means. The detector means may include a photo detector positioned to detect light reflected from the film.

The film may have a reflective surface and a non-reflective surface. Alternatively, the film may have color filters which attenuate only a part of the spectrum of light from the source. In the latter case the detectors would have corresponding filters which would enable them to detect multiple switch states. Another possibility would be to employ reflectors with graduated reflectivities for use as continuously variable controllers.

It is possible to avoid the need for a directional coupler between the light source and the detectors by using a plurality of light fibers in a bundle with only some coupled to the light source and only the remainder coupled to the detector(s). Such an arrangement avoids the need of having to extract the light signal from a potentially large background bias level due to Fresnel reflections, Rayleigh scattering and other imperfections. A dual fiber system does not suffer from this problem because the return fiber(s) captures only forward coupled light. However, in order for a dual fiber system to work a gap must be provided between the mirror surface and the fibers, so that some off axis rays can couple from one fiber to the other.

A dual fiber system can avoid the problems associated with gap contamination and other problems that attenuate the light by providing a transparent layer of selected thickness in front of the mirror surface. The flexible film may be transparent of the selected thickness with a mirror coating on the back so that the film itself provides the requisite spacing without permitting the entry of contamination.

BRIEF DESCRIPTION OF THE DRAWINGS

The novel features believed characteristic of the invention are set forth in the appended claims. The invention itself, however, as well as other features and advantages thereof, will be best understood by reference to the description which follows, read in conjunction with the accompanying drawings, wherein:

DETAILED DESCRIPTION WITH REFERENCE TO THE DRAWINGS

Figure 1:
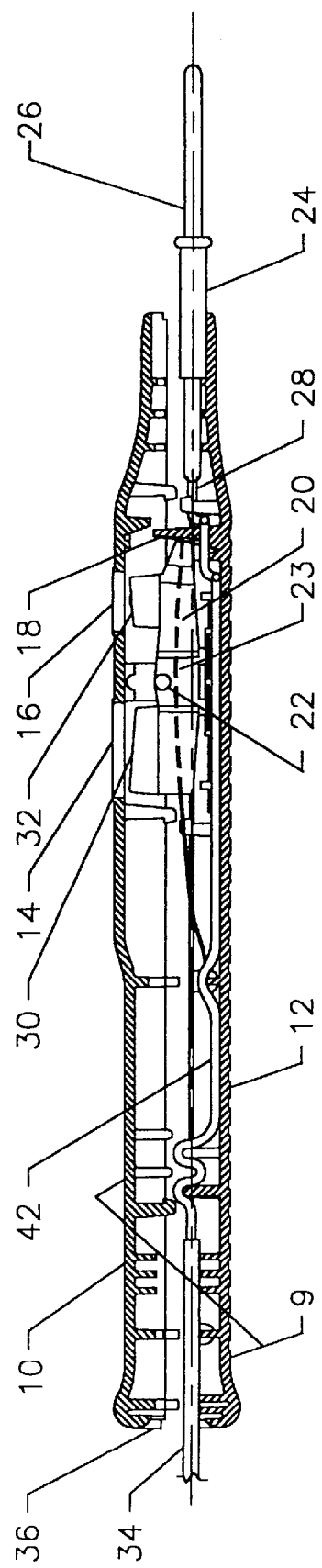
FIG. 1 is a side elevation view in section of an electrosurgical pencil with the halves of the casing slightly separated.

Referring to FIG. 1, the casing of the electrosurgical pencil 9 is made up of two casing portions 10 and 12. The internal components of the pencil 9 are installed on the recess in casing portion 12. The components include an electrode 26 which passes through a sleeve 24 and has attached at its anterior end a conductive cable 28. Cable 28 is run along the bottom interior surface of the casing portion 12 entering a cable sleeve 34 before exiting through the rear aperture 36 of the pencil 9. Voltage applied to cable 28 by a remote power source (not shown) is controlled by means of an optical fiber switching assembly composed of a light fiber 42 that runs in sleeve 34 adjacent cable 28. The optical fiber is captured by switching actuator 20. The fiber 42 runs all the way through the interior of actuator 20.

Figure 2:
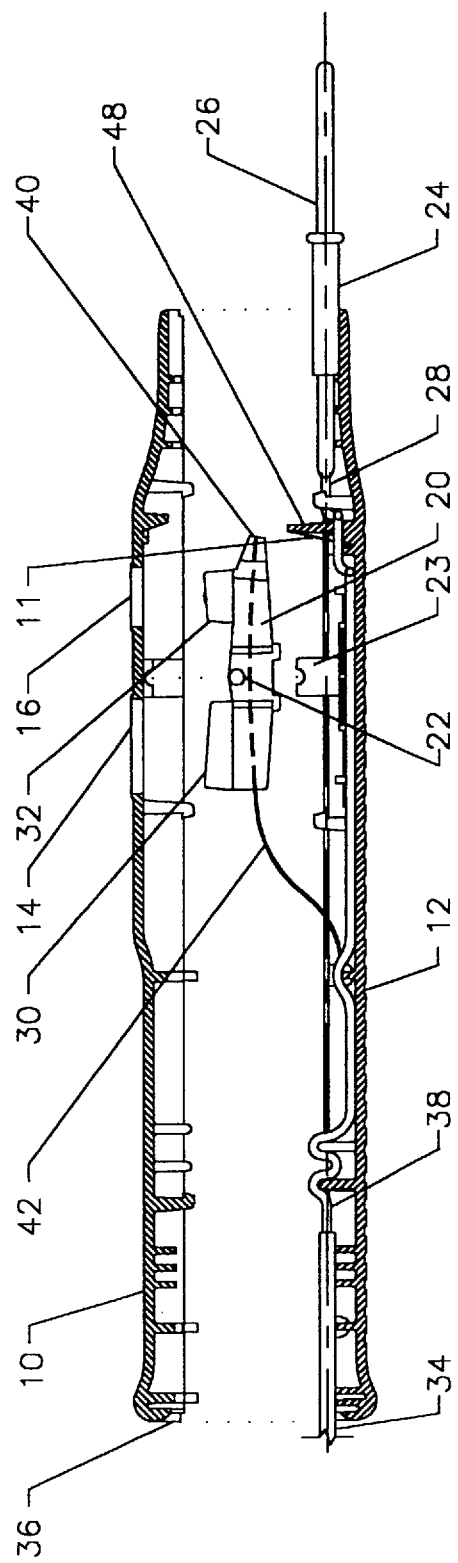
FIG. 2 is a side elevation view of the device of FIG. 1 with the two halves of the casing separated and the switching actuator detached.

Referring to FIG. 2 switching actuator 20 is pivotally attached to a pair of spaced apart mounting brackets 23 by means of pivotal pins 22 which project from either side of actuator 20 and fit into receptacles in the mounting brackets 23. Actuator 20 has a pair of protruding knobs 30 and 32 at opposite ends thereof. Knobs 30 and 32 pass through apertures 14 and 16, respectively, in casing portion 10 when the two casing portions 10 and 12 are engaged. Fiber 42 passes through actuator 20 and ends at end face 40 and then switching actuator 20 is pivotally mounted on mounting brackets 23 and end face 40 abuts flexible film 11.

Figure 3:
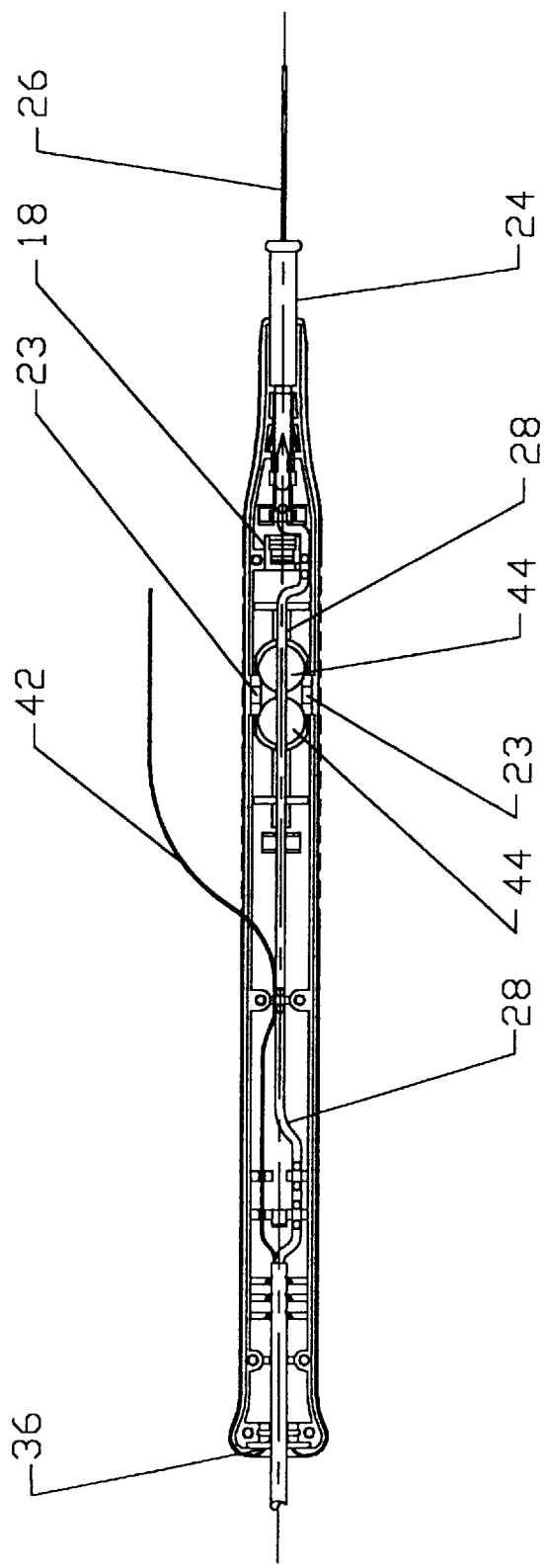
FIG. 3 is a plan view of the device of FIGS. 1 and 2 with the switching actuator removed from view.
Figure 4:
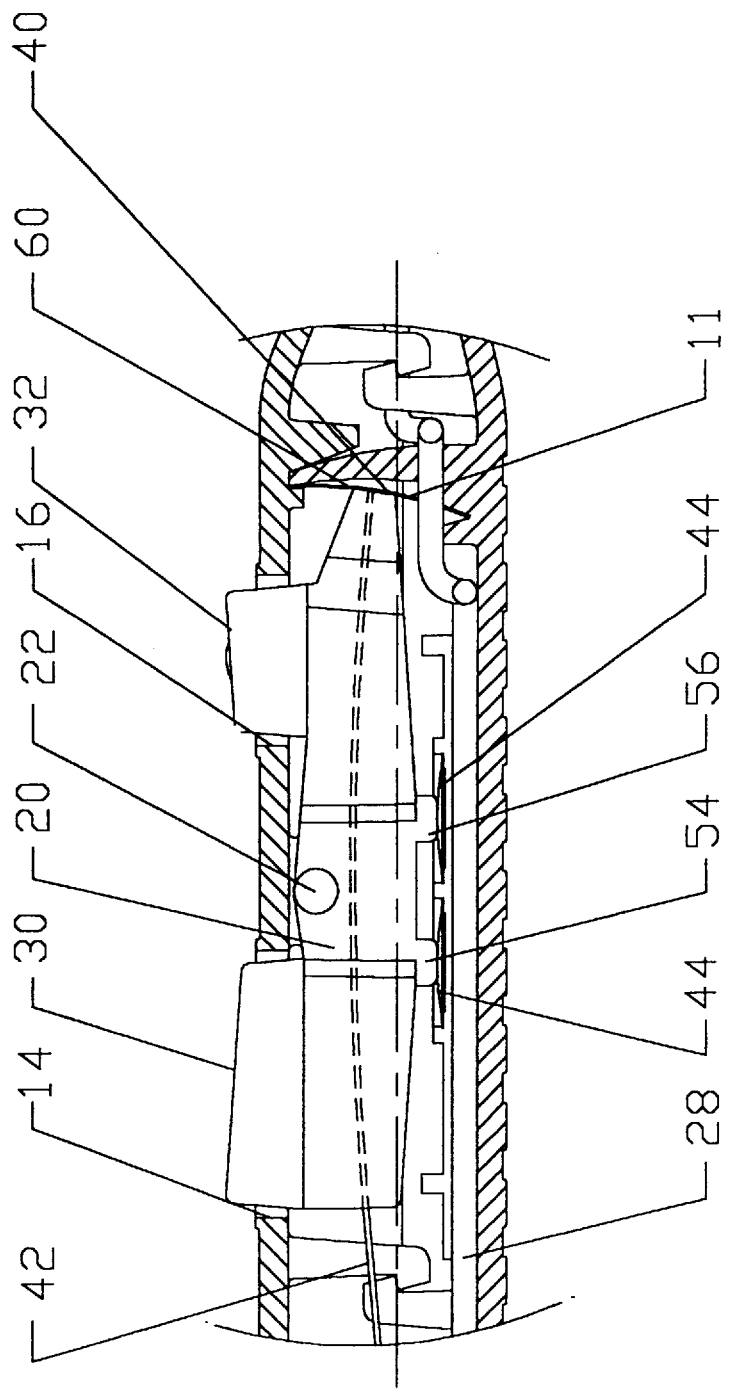
FIG. 4 is a partial sectional view in side elevation of the device of FIGS. 1 to 3 showing the switching actuator and the mirror assembly.

Referring to FIG. 3, showing a top view of the device of FIGS. 1 and 2 without the actuator 20 in place, it will be seen that on the base of the casing portion 12 between mounting brackets 23 there are located two spring pads 44. The spring pads 44 are more clearly shown in FIG. 4 as consisting of a slightly convex sheet material mounted within a shallow circular receptacle. Contact projections 54 and 56 of the switching actuator 20 abut the spring pads 44 when in position. At the same time, end face 40 abuts flexible film 11 as shown. By depressing on knob 30, switching actuator 20 pivots about pins 22. When knob 30 is depressed it causes projection 54 to depress spring pad 44 and end face 40 to move upwardly while maintaining contact with flexible film 11. Alternatively, depression of knob 32 causes projection 56 to depress spring pad 44 and end face 40 to move downwardly while maintaining contact with flexible film 11. Spring pads 44 ensure that without pressure on either knob 30 or 32, switching actuator 20 will be maintained in an intermediate position.

Figure 5:
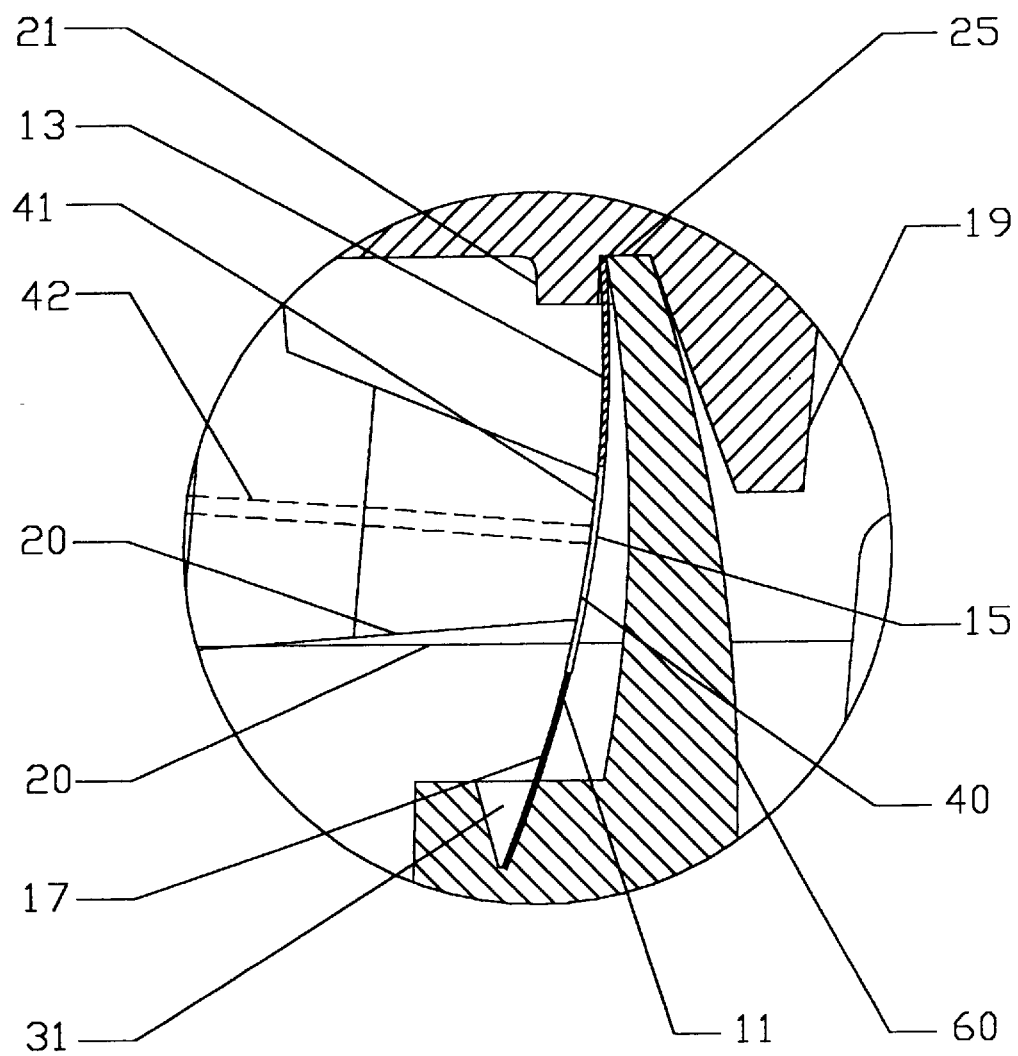
FIG. 5 is a partial sectional view in side elevation of the flexible filter, the end of the switching actuator, showing the fiber tip aligned to the central clear section of the filter.
Figure 6:
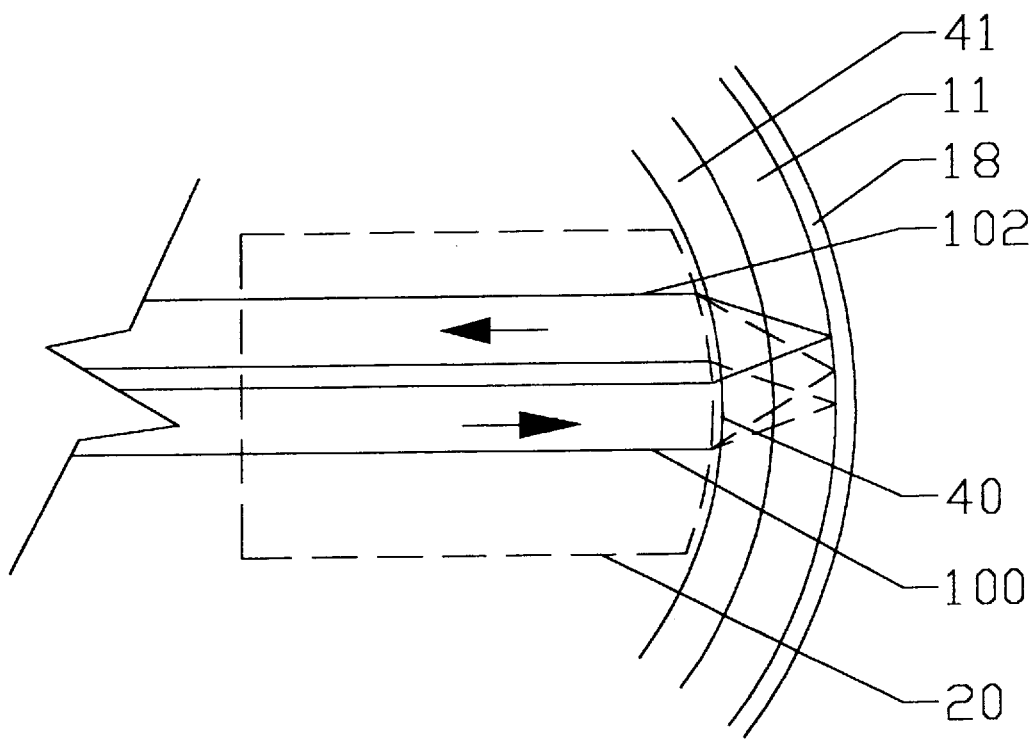
FIG. 6 is a partial sectional view of a portion of an embodiment of the flexible film as in FIG. 5 but showing the structure in more detail including two filter sections, an intermediate transparent section and a transparent protective coating.

Referring to FIGS. 5 and 6, the flexible film mounting arrangement is shown as consisting of mounting bracket 60 affixed to casing half 12 and fitting between a recess 25 formed by projecting elements 19 and 21 belonging to casing portion 10. Flexible film 11 is positioned so that it is locked in position between recess 25 and mounting bracket 60. The film 11 itself is cemented in a trough 31 at the base of mounting bracket 60. Flexible film 11 is mylar having a mirror surface 18 formed of an aluminum film on its surface remote from end face 40. The film 11 has a filter 13 formed adjacent one side of a central transparent portion 15 and another filter 17 of a different color formed on the other side thereof. A protective coating 41 overlays the film 11 to protect it from scratching.

In the intermediate position, end face 40 is positioned against the transparent portion 15 in which film 11 simply acts as a reflector. Most of the light that exits fiber 42 is reflected by film 11 at its remote surface and returned back along fiber 42. Because of the contact that is maintained between the flexible film 11, the actuator 20 and fiber 42, there is limited back scattering and loss of light due to contamination. Upon moving so that end face 40 abuts filter 13, light emanating from fiber 42 passes through filter 13, is reflected from the mirror surface 18 and is returned into fiber 42. Similarly, when actuator 20 is pivoted so that end face 40 abuts filter 17, a similar effect is produced.

Figure 7:
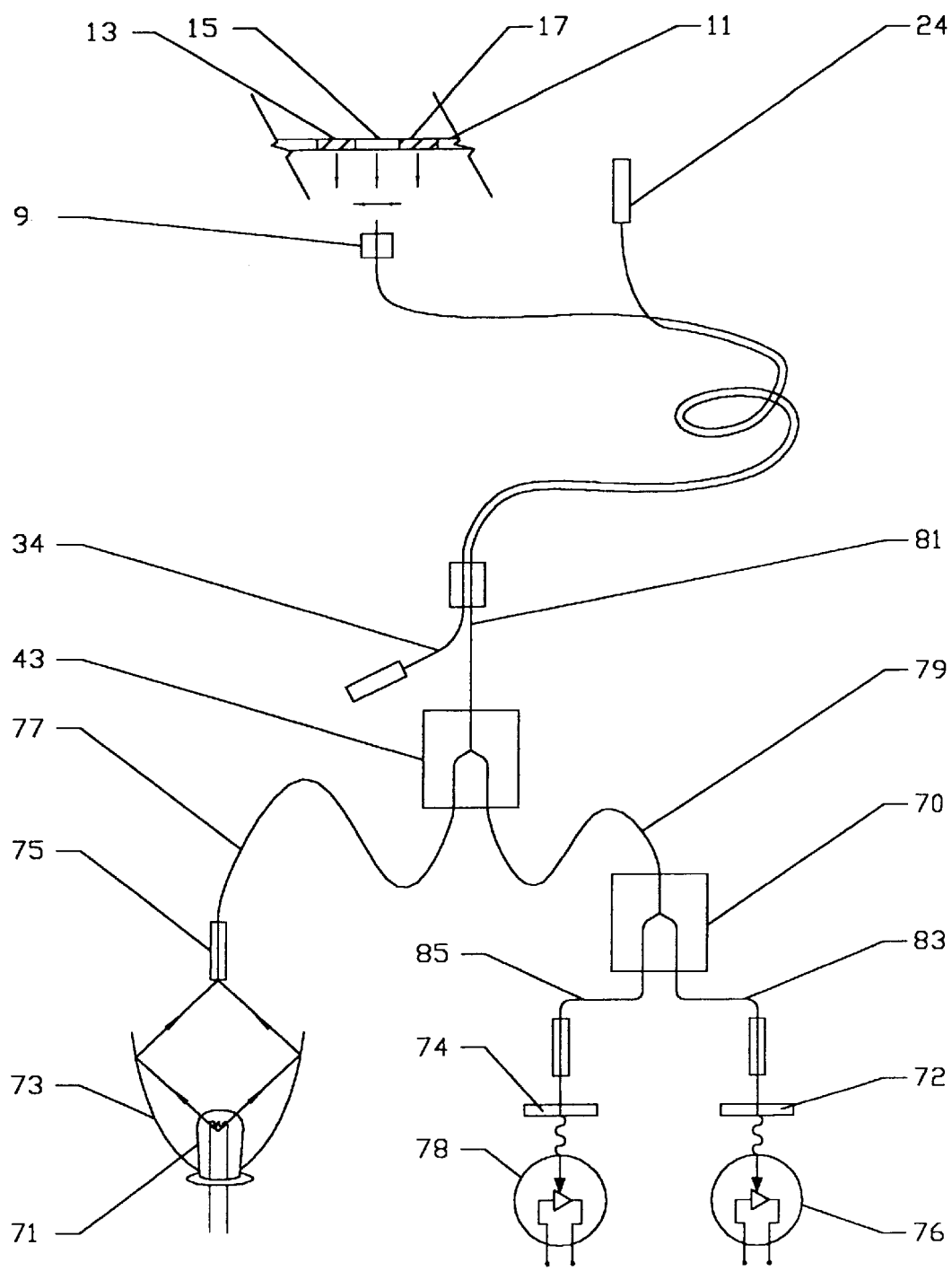
FIG. 7 is a schematic diagram of a single fiber switching system in which the mirror has a central transparent area and two adjacent filter areas.

Referring to FIG. 7, a broad band (multi-spectral) light source 71 emits light onto a parabolic reflector 73 which directs the reflected light into a ferrule 75 coupled to an optical fiber 77. Light from the fiber 77 enters a directional coupler 43 which directs approximately half of the light into fiber 81. The directional coupler 43 is usually a beam splitter but may also be a butt coupling of fibers or a graded index rod lens as is known in the art. Light travels down fiber 81 into electrosurgical pencil 9. Light emerging from the end of fiber 81 is incident on one of three areas of film 11. Central transparent portion 15 is clear with only the mirror surface 18 on the back while filters 13 and 17 are coloured. The reflected light enters into fiber 81 and travels down to directional coupler 43 where some of the light is directed into fiber 79 into beam splitter 70. Part of the light travels down fiber 83 and part down fiber 85. Filters 72 and 74 are complementary to filters 13 and 17, respectively, and are used to determine in which of the three positions the end face 40 of pencil 9 is located, in order to discriminate the wave length components contained in the reflected light. For example, if the light was passed first through a red filter and then reflected back into the fiber, by passing the filtered light through a complementary corresponding cyan filter, it can be determined whether or not the end face was abutting the red filter. Similarly, by using a green filter on the other side of the unfiltered portion of the film 11 and passing the corresponding reflected light through a corresponding magenta filter, it can be determined whether or not the end face 40 was abutting the green filter. Detectors 76 and 78 detect any light that may be transmitted through the corresponding filters 72 and 74.

By utilizing a reflective filter in contact with the optical fiber, sufficient contrast and efficiency of reflection takes place to allow the different switching states to be determined. The absence of any gaps makes the switching assembly less sensitive to contaminants from adverse environments including fluids and air-borne particulate which may coat the optical faces if they are otherwise separated. The absence of any gap also makes the switching assembly insensitive to normal optical losses from separation between any source and receiver of similar dimensions and numerical aperture.

Figure 8:
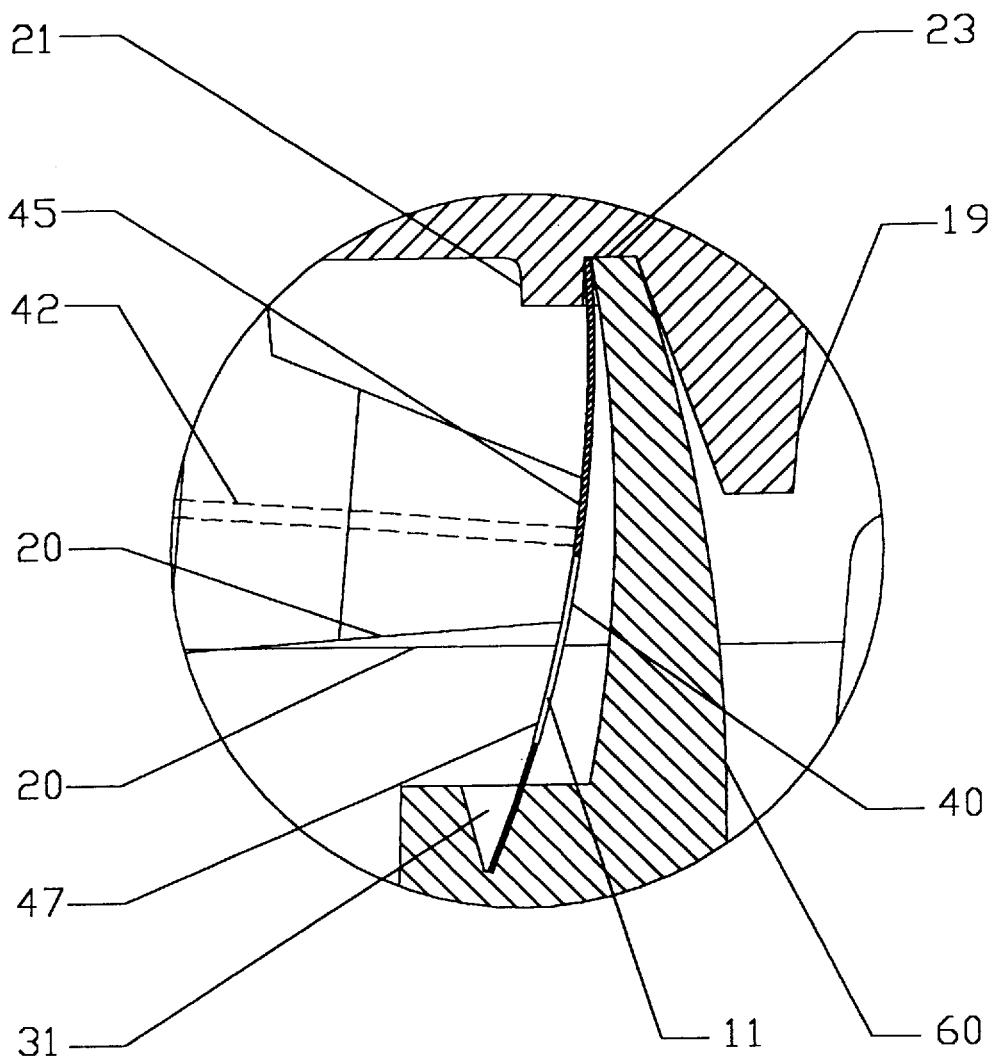
FIG. 8 is a partial sectional view in side elevation of the end of the switching actuator, showing the fiber tip aligned to the upper section of the film, having two different reflective surfaces.

Referring to FIG. 8 there is shown a flexible film 11 having only two reflective surfaces. Surface 45 is opaque while surface 47 is reflective. Consequently, a single photo detector 76 without filter 72 in FIG. 6 will suffice to detect the two different positions and hence two states of the actuator or switching actuator 20.

Figure 9:
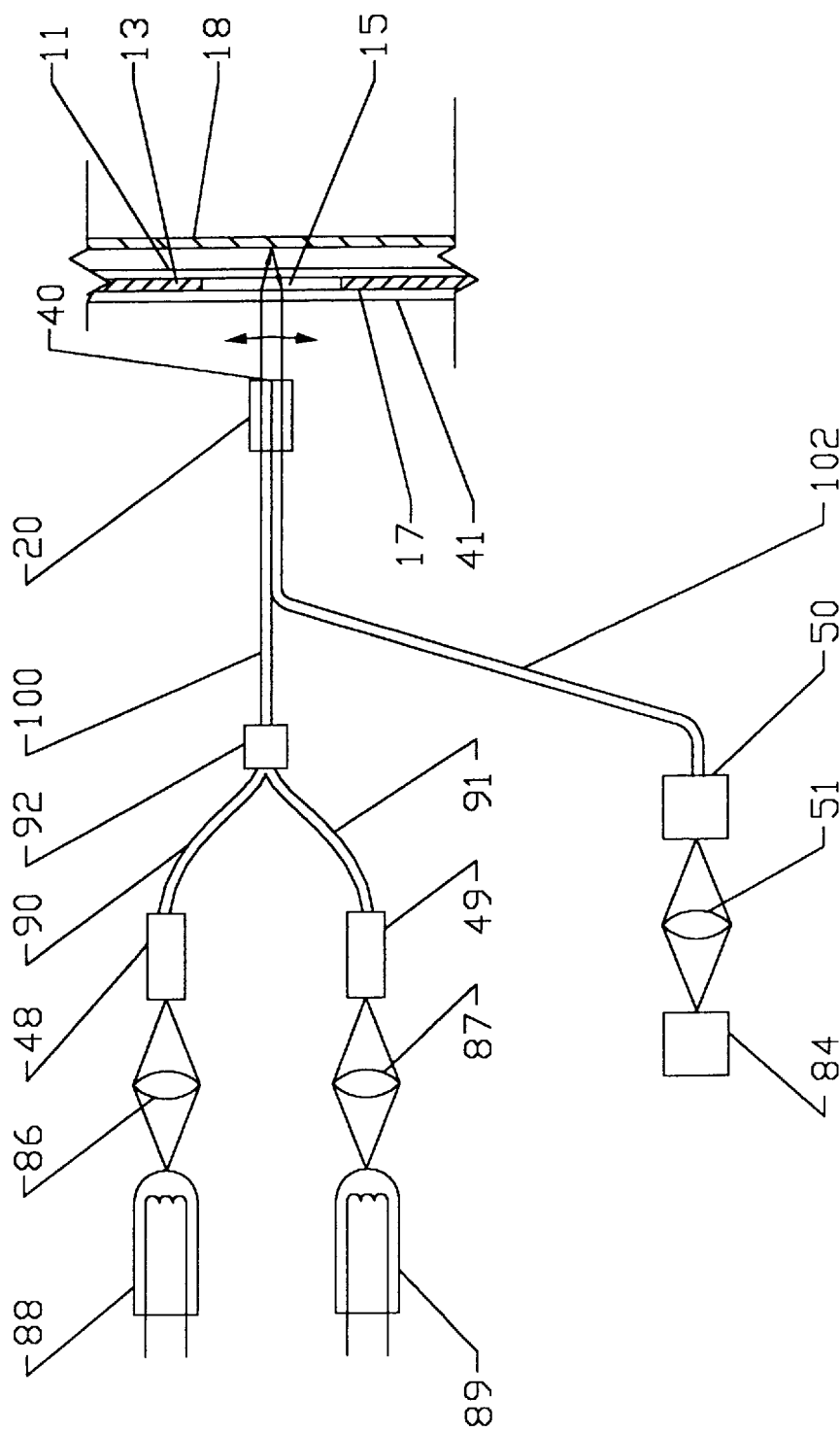
FIG. 9 is a schematic view of system utilizing a send fiber and a receive fibre.

Referring to FIGS. 6 and 9, a red light emitting diode 88 and a green light emitting diode 89 are focused by lenses 86 and 87 onto ferrules 48 and 49, respectively. The light enters fibers 90 and 91 and conducts to directional coupler 92 where it is combined into send fiber 100. The red and green light arrives at actuator 20 from which it is emitted and is incident upon the flexible film 11. The light passes through the clear protective coating 41 through film 11 and is reflected from mirror surface 18. The reflected light enters return fiber 102, conducts to ferrule 50 where it is emitted onto lens 51 which focuses the light onto photo detector 84. The gap that would normally be required in order to couple light from one fiber to the other is substituted for by the transparent flexible film 11 and the protective clear coating 41 which provides a smooth surface for contact with end face 40 and prevents abrasion of the film 11, contamination and other problems that attenuate the light.

Figure 10:
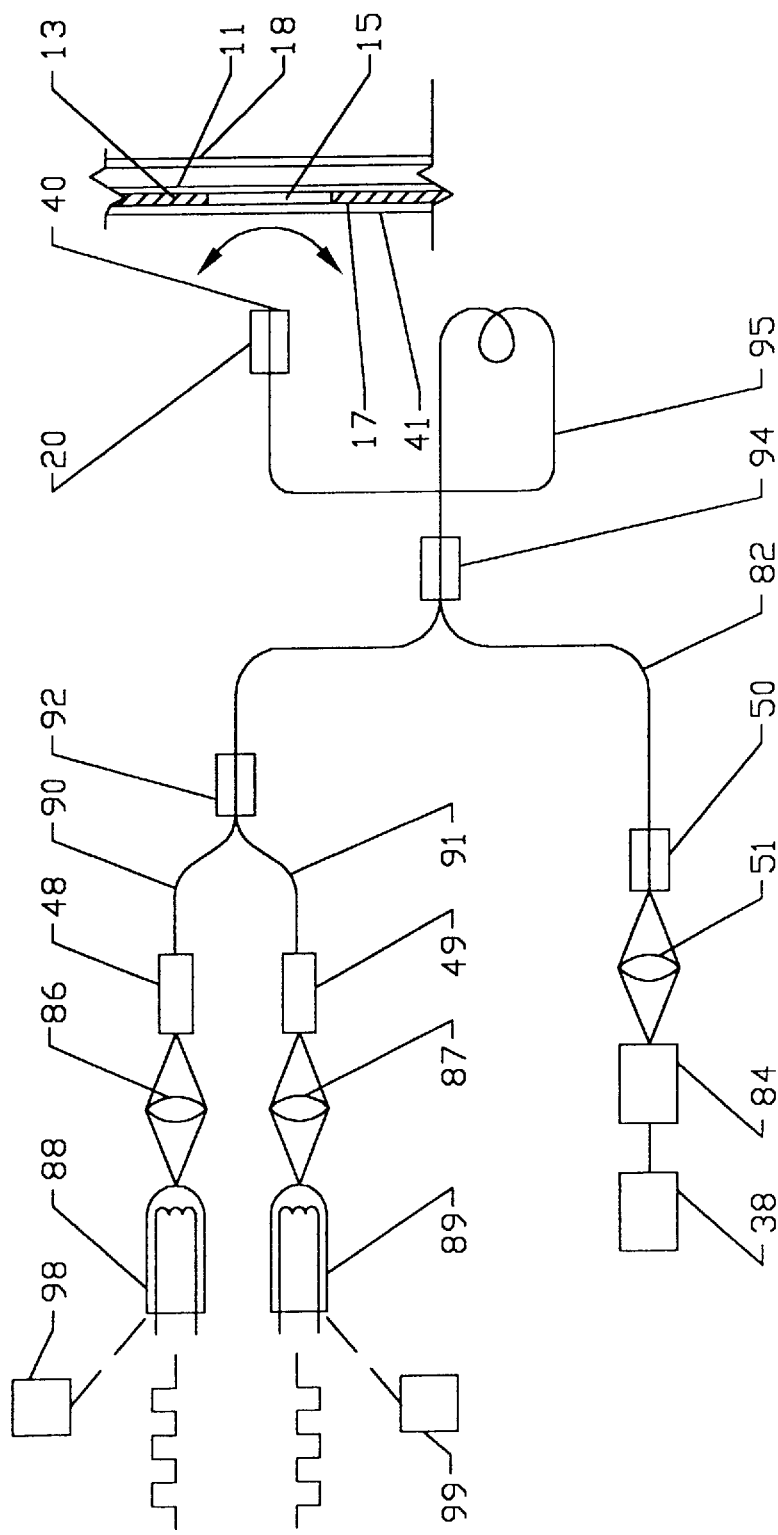
FIG. 10 is a schematic view of a single fiber system in which light from each of two light emitting diodes is modulated differently and combined into one fibre and the reflected light is detected and decoded.

Referring to FIG. 10, a pair of light emitting diodes 88 and 89, the first one emitting modulated red light and the other, modulated green light, direct their respective light onto lenses 86 and 87. The amplitude of the light from the light emitting diodes 88 and 89 is modulated electronically by modulators 98 and 99, respectively, to generate distinct temporal signals, such as alternating pulse trains which are 180 degrees out of phase. Lenses 86 and 87 focus the light into corresponding light fibers 90 and 91 which carry the light to a directional coupler 92 where the red and green light pulses are combined into a single fiber 93. Fiber 93 carries the light pulses to a second directional coupler 94 which couples the light into another single fiber 95. Fiber 95 connects to actuator 20 positioned to wipe over flexible film 11 having filter regions 13 and 17 and transparent center portion 15. Returning reflected light is coupled into fiber 82 where it is directed onto photo detector 84. The reflected light is detected by photo detector 84 and then decoded by decoder 38 in order to determine from which light source the light is coming. Detected light is discriminated by the photo detector 84 by synchronizing the detected signal with the source modulation signal from modulators 98 and 99.

Obviously different filter combinations with a differing number of filters may be employed to produce either fewer or a greater number of switching states. Alternatively, a graduated filter may be used to determine the position of end face 40 if switching actuator 20 were to be connected to an electro-mechanical device. Another option is to use complementary filters matched to the wavelength of the light sources. For example, if light emitting diodes 88 and 89 emit green and red, respectively, and filters 13 and 17 are magenta and cyan, respectively, then with the actuator 20 juxtaposed to the magenta filter, detector 84 will detect red light. Alternatively, with the actuator 20 next to the cyan filter 17 the detector 84 will detect green light. Similarly, if the filters 13 and 17 are green and red, respectively, then detector 84 will detect green light if the light from actuator 20 is incident on the green filter. The detector 84 will detect red light if the actuator 20 is next to the red filter.

It is clear that the electrosurgical pencil 9 is but one of may different devices in which the invention could be employed. For example, the invention could be incorporated into an ordinary dual or multistate switch on a switch panel. It could be used to detect slight misalignment on critical machine parts but replacing the single mirrored surface on the back of the flexible film 11 with a film with one having a graded filter. A slight change in alignment of the latter would change the amount of reflected light entering the fiber.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

We claim:

1. A fiber optical switching system for use with a light source, comprising:

(a) an optical switch having a movable actuator;

(b) an optical fiber coupled to said actuator and terminating substantially at an end surface thereof for conducting light from the light source to said optical switch mechanism;

(c) a flexible reflective film whose reflectivity is conditioned to provide at least two different reflective surfaces and positioned such that an end surface of said optical fiber abuts said film throughout its movement from one reflective surface to another, wherein light reflected by said film is directed back into said optical fiber; and (d) a detector coupled to an end of said optical fiber for detecting light reflected from said film into said optical fiber so as to determine from which reflective surface of said film light has been reflected.

2. A system according to claim 1, wherein said film has a reflective coating applied to a surface furthest from the end surface of said optical fiber and said film against which the reflective coating is applied is coloured by a selected color.

3. A system according to claim 1, including a directional coupler coupled to said optical fiber means to direct light returning from said optical switch to said detector means.

4. A system according to claim 1, wherein said optical fiber means includes a send fiber coupled between said actuator and said light source and a return fiber coupled between said actuator and said detector means and wherein said film is transparent and has a reflective surface on a side opposite said optical fibers wherein said film is of a selected thickness so as to maximize the coupling of light emitted from one of said fibers and received by another of said fibers.

5. A system according to claim 1, wherein said detector means includes a photo detector positioned to detect light reflected from said film into said optical fiber means.

6. A system according to claim 1, wherein said film has a reflective surface abutting an end surface of said optical fiber in a first position of said actuator and a non-reflective surface abutting an end surface of said optical fiber in a second position of said actuator.

7. A system according to claim 1, wherein said film has more than two reflective surfaces and said detector means includes as many photo detectors and filters as there are reflective surfaces.

8. A system according to claim 1, wherein said film is mylar.

9. A system according to claim 1, wherein said flexible film includes a transparent substrate, a mirror coating on a back surface of said substrate and filters on a front surface of said substrate.

10. A system according to claim 9 including a scratch resistant transparent coating over said film.

11. A system according to claim 1, including two light sources emitting two different wavelengths of light and wherein said reflective surfaces are conditioned to reflect complimentary wavelengths matched to the wavelength of light from respective ones of said light sources, and means for modulating light from each of said light sources with a characteristic modulating signal and wherein said detector means is a single detector having a decoder for identifying the modulating signal present.

12. A fiber optical switching system, comprising:
  (a) a light source emitting multiple wavelengths of light;
  (b) an optical switch having a movable actuator;
  (c) an optical fiber coupled to said actuator and terminating substantially at an end surface thereof for conducting light from said light source to said optical switch;
  (d) a flexible reflective film mounted in said optical switch having a plurality of different reflective surfaces and positioned such that an end surface of said optical fiber abuts said film as it moves among positions in which light from said light fiber means is incident on said reflective surfaces; and
  (e) a plurality of photo detectors and associated filters, each photo detector and filter corresponding to a respective one of said reflective surfaces, said photo detectors and filters coupled to said optical fiber means and being operative to detect light reflected from said film into said optical fiber so as to permit determination of the location of said actuator.

13. A system according to claim 12, wherein said light fiber means provides a single light path to and from said optical switch mechanism.

14. A fiber optical switching system, comprising:
  (a) a light source emitting multiple wavelengths of light;
  (b) an optical switch having a movable actuator;
  (c) an input and output optical fiber coupled to said actuator and terminating substantially at an end surface thereof said input optical fiber for conducting light from said light source to said optical switch and said output optical fiber for conducting light from said optical switch;
  (d) a flexible reflective film mounted in said optical switch having a first reflective surface and a second reflective surface and positioned such that an end surface of said optical fibers abut said film as it moves from a position in which light from said input light fiber is incident on said first reflective surface to one in which it is incident on said second reflective surface; and
  (e) a photo detector coupled to said second optical fiber and being operative to detect light reflected from said film into said second optical fiber so as to permit determination of the position of said actuator.

* * * * *